(12) United States Patent
Steffen et al.

(10) Patent No.: US 9,196,590 B2
(45) Date of Patent: Nov. 24, 2015

(54) PERFORATED ELECTRONIC PACKAGE AND METHOD OF FABRICATION

(71) Applicants: STMicroelectronics (Grenoble 2) SAS, Grenoble (FR); STMicroelectronics (Rousset) SAS, Rousset (FR)

(72) Inventors: Francis Steffen, Saint-Maximin (FR); Delphine Mathey, Grenoble (FR); Gilbert Assaud, Marseille (FR); Rémi Brechignac, Grenoble (FR)

(73) Assignees: STMicroelectronics (Grenoble 2) SAS, Grenoble (FR); STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 14/640,237

(22) Filed: Mar. 6, 2015

(65) Prior Publication Data

US 2015/0262941 A1 Sep. 17, 2015

(30) Foreign Application Priority Data

Mar. 11, 2014 (FR) .................................. 14 51979

(51) Int. Cl.
*H01L 23/28* (2006.01)
*H01L 23/00* (2006.01)
*H01L 23/31* (2006.01)
*H01L 23/04* (2006.01)
*H01L 23/522* (2006.01)
*H01L 21/311* (2006.01)
*H01L 21/56* (2006.01)

(52) U.S. Cl.
CPC ........ *H01L 23/562* (2013.01); *H01L 21/31105* (2013.01); *H01L 21/565* (2013.01); *H01L 23/04* (2013.01); *H01L 23/315* (2013.01); *H01L 23/3107* (2013.01); *H01L 23/3121* (2013.01); *H01L 23/3128* (2013.01); *H01L 23/522* (2013.01); *H01L 23/57* (2013.01)

(58) Field of Classification Search
CPC ... H01L 23/04; H01L 23/315; H01L 23/3107; H01L 21/565
USPC ................... 257/787, E23.128; 438/113, 127
See application file for complete search history.

(56) References Cited

U.S. PATENT DOCUMENTS

| | | | | |
|---|---|---|---|---|
| 6,830,956 | B2 * | 12/2004 | Masumoto ............ | H01L 21/481 257/E23.092 |
| 7,901,990 | B2 * | 3/2011 | Letterman, Jr. ....... | H01L 21/561 257/685 |
| 8,304,285 | B2 * | 11/2012 | Gerber .................. | H01L 21/561 257/680 |
| 2007/0290376 | A1 * | 12/2007 | Zhao et al. ..................... | 257/787 |
| 2009/0146285 | A1 * | 6/2009 | Pu et al. ......................... | 257/686 |
| 2010/0109132 | A1 * | 5/2010 | Ko et al. ........................ | 257/660 |
| 2011/0165731 | A1 * | 7/2011 | Gerber et al. ................. | 438/107 |
| 2011/0233747 | A1 | 9/2011 | Lee et al. | |

(Continued)

OTHER PUBLICATIONS

INPI Search Report and Written Opinion for FR 1451979 dated Feb. 18, 2015 (7 pages).

*Primary Examiner* — Nitin Parekh
(74) *Attorney, Agent, or Firm* — Gardere Wynne Sewell LLP

(57) ABSTRACT

An electronic package includes an integrated circuit chip mounted to a support plate and encapsulated by an encapsulating body. The package includes at least one weakening deep perforation. The perforation is formed in either the support plate or the encapsulating body, and functions to reduce a resistance of the package to bending stresses perpendicular to the support plate.

20 Claims, 2 Drawing Sheets

(56) References Cited

U.S. PATENT DOCUMENTS

2012/0086003 A1 4/2012 Park
2014/0017843 A1* 1/2014 Jung et al. .............. 438/51
2015/0084168 A1* 3/2015 Ding ............... H01L 23/3107
257/669

* cited by examiner

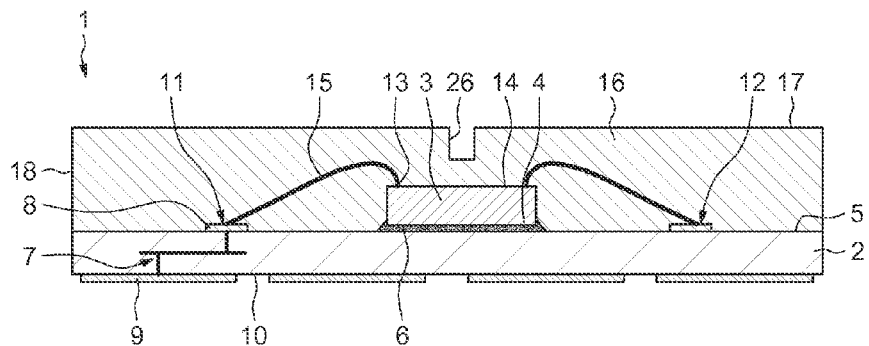
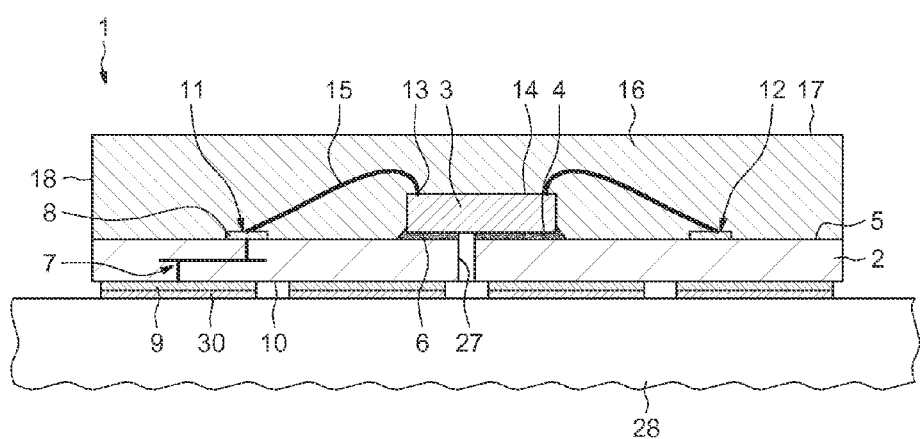
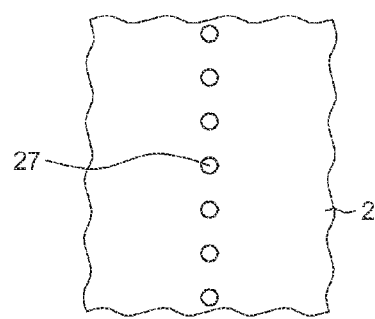

PERFORATED ELECTRONIC PACKAGE AND METHOD OF FABRICATION

PRIORITY CLAIM

This application claims priority from French Application for Patent No. 1451979 filed Mar. 11, 2014, the disclosure of which is incorporated by reference.

TECHNICAL FIELD

The present invention relates to the field of electronic packages.

BACKGROUND

Electronic packages exist which are fixed by adhesive bonding onto objects, with a view to the identification of these objects when the latter are installed on equipment. This is in particular the case for ink cartridges designed to be installed on reproduction equipment.

It is nevertheless common for these electronic packages to be separated from the objects carrying them and to be re-attached to undesirable objects that may nevertheless be installed on the equipment.

SUMMARY

According to one variant embodiment, an electronic package is provided comprising at least one integrated circuit chip, means of support for the chip and electrical connection means.

The electronic package can have at least one weakening deep perforation formed in the means of support reducing the resistance of the package to bending stresses perpendicular to the support plate.

The weakening perforation can extend to a short distance from the chip.

The weakening perforation can extend to a short distance from said electrical connection means.

The means of support can comprise a support plate for the chip, where the weakening perforation can be formed in this support plate.

The means of support can comprise an encapsulation block in which the chip and the electrical connection means are buried, where the weakening perforation can be formed in the encapsulation block.

The perforation can be formed perpendicularly to the support plate.

The weakening perforation can comprise at least one groove.

The weakening perforation can comprise at least one hole.

A method for fabricating a weakened electronic package is also provided comprising the fabrication of an electronic package comprising at least one integrated circuit chip, means of support for the chip and electrical connection means and comprising the later formation of at least one weakening deep perforation in the means of support.

The perforation may be formed so as to extend to a short distance from the chip and/or to the electrical connection means.

The perforation may be formed in such a manner as to comprise at least one groove and/or at least one hole formed by sawing or by drilling.

BRIEF DESCRIPTION OF THE DRAWINGS

Electronic packages will now be described by way of non-limiting examples, illustrated by the appended drawings in which:

FIG. 3 shows one variant embodiment of an electronic package;

FIG. 4 shows another variant embodiment of an electronic package; and

FIG. 5 shows a partial top view of the electronic package in FIG. 4.

DETAILED DESCRIPTION OF THE DRAWINGS

Figure 1:
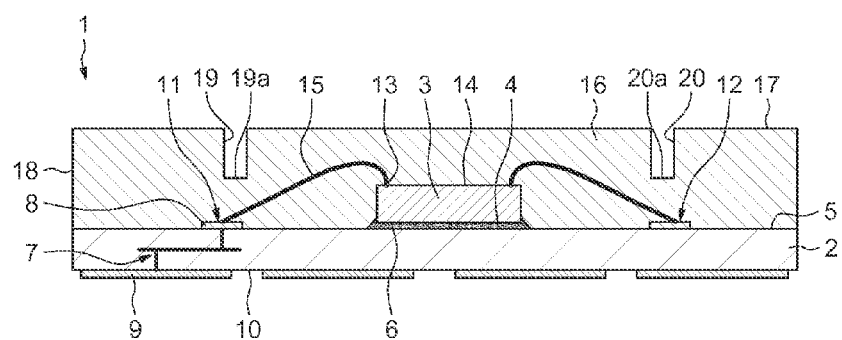
FIG. 1 shows a cross-section of an electronic package.

An electronic package 1 shown in FIG. 1 comprises means of support which comprise a support plate 2, for example made of a composite of glass fiber and resin, and an integrated circuit chip 3 one rear face of which is mounted on a front face 5 of the support plate 2 by means of a layer of adhesive 6.

The support plate 2 is equipped with an electrical through-connection network 7 having front lugs (pads) 8 arranged on the front face 5 of the support plate 2 and external rear lugs (pads) 9 arranged on a rear face 10 of the support plate 2. The front lugs 8 are disposed for example in two rows 11 and 12 situated on either side of the chip 3.

Front lugs (pads) 13 of the chip 3, arranged on a front face 14 of the latter, are connected to the front lugs 8 of the network 7 by means of electrical connection wires 15 whose ends are respectively soldered to these lugs.

The means of support for the electronic package 1 further comprises an encapsulation block 16, for example made of a resin, which is arranged on top of the rear face 5 of the support plate 2 and in which the chip 3, the front lugs 8 and 13 and the electrical connection wires 15 are buried.

The support plate 2 is, for example, rectangular or square and the encapsulation block 16 completely covers the front face 5 of the support plate 2 and has a front face 17 parallel to the support plate 2 and peripheral sides 18 perpendicular to the support plate 2.

For example, the electronic package 1 is produced by collective fabrication in the form of a wafer with several adjacent packages and of a separation operation by sawing up this wafer perpendicularly to the support plate 2, in such a manner that the electronic package 1 takes the form of a rectangular parallelepiped.

The electronic package 1 is distinguished by the fact that the encapsulation block 16 comprises perforations taking the form of two deep grooves 19 and 20 for weakening or for degrading which are formed starting from its front face 17 perpendicularly to the support plate 2.

The weakening deep grooves 19 and 20 are situated approximately on top of, in other words directly above with respect to the support plate, the rows of lugs 11 and 12 and the bottoms 19a and 20a of these grooves 19 and 20 extend to a short distance from the front lugs 8 and from the soldered ends of the electrical connection wires 15, without however exposing them.

The weakening grooves 19 and 20 can be formed by machining, for example and quite simply by the passage of a saw parallel to the support plate 2, from one edge to the other of the encapsulation block 16.

The result of the preceding operation is that, in the neighborhood of the grooves 19 and 20, the resistance of the electronic package 1, notably its resistance to bending stresses perpendicular to the support plate 2, is reduced.

Figure 2:
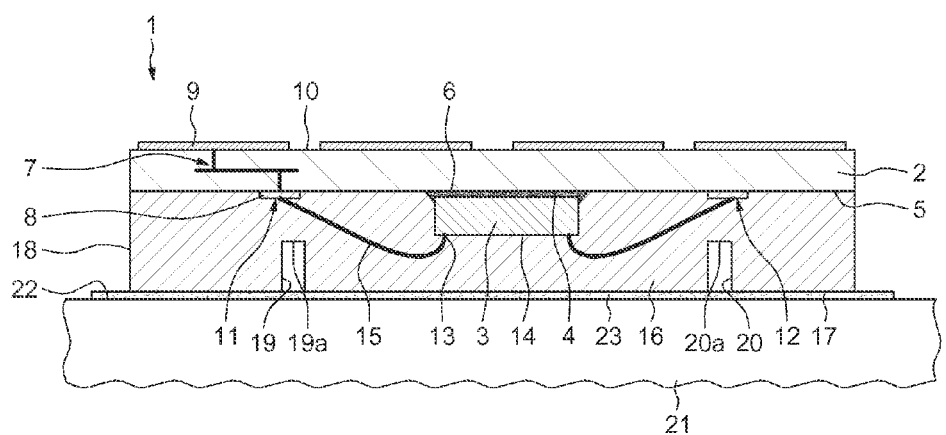
FIG. 2 shows a cross-section of an installation of the electronic package in FIG. 1.

As illustrated in FIG. 2, the electronic package 1 is mounted on a platen 21 in a position such that the front face of the encapsulation block of the electronic package 1 is directly facing a surface 22 for receiving the platen 21 and is fixed onto this receiving surface 22 by means of a layer of adhesive 23.

If a person of malicious intent tries to pry off the electronic package 1, for example with the aid of a tool, and potentially manages to do it, then, this operation causes the electronic package 1 and/or the platen 21 to bend leading to a bending of the electronic package 1, at least in the neighborhood of the grooves 19 and 20, and inevitably causes irreversible damage to, or even a breakage of, the electronic package 1 at least in the neighborhood of at least one of the grooves 19 and 20 and, as a consequence, damage to the internal electrical connections (notably to the lugs 8, to the wires 15, to the associated solder joints and/or to the electrical connection network 7) of the chip 3 inside the electronic package 1. Thus, the electronic package 1 will get at least partially destroyed and will no longer be usable.

According to another application, if the platen 21 undergoes a deformation, this deformation can lead to a partial deterioration of the electronic package 1 in the neighborhood of the grooves 19 and 20, by rupture of some of the internal, for example specially dedicated, electrical connections such that the electronic package 1 will then exhibit a degraded or different operation which is able to be detected.

According to one variant embodiment illustrated in FIG. 3, the electronic package 1 does not have the weakening grooves 19 and 20 in FIG. 1, but has one weakening deep groove 26 which is formed in the encapsulation block 16 starting from its front face 17, for example produced by a single saw line, and which passes above and near to the front face 14 of the chip 3, parallel to and at a distance from two parallel rows of front lugs 13 of this chip 3.

The consequence of this is that, in the neighborhood of the groove 26, the resistance of the electronic package 1 is reduced, in such a manner that, in an equivalent way to the example described with reference to FIG. 1, any attempt to tear off the electronic package 1 mounted on a receiving surface causes it to be damaged, notably in the neighborhood of the weakening groove 26, by breaking at least some of its internal electrical connections.

According to one variant embodiment illustrated in FIGS. 4 and 5, the electronic package 1 has neither the weakening grooves 19 and 20 of FIG. 1 nor the weakening groove 26 of FIG. 3, but has a plurality of spaced out deep holes for weakening 27 which are this time formed in the support plate 2 starting from its rear face 10, by machining for example using laser radiation, in a region not comprising the electrical connection network 7. According to the example shown, the holes 27 pass completely through the support plate 2, and, in the region of the chip 3, extend to a short distance from the rear face 4 of the latter.

As illustrated in FIG. 4, the electronic package 1 can be mounted on a printed circuit board 29, equipped with electrical contact lugs 30 onto which the electrical connection lugs 9 are soldered.

In an equivalent manner to the preceding examples, the weakening holes 27 render the electronic package 1 fragile, such that any attempt to tear off the electronic package 1 mounted onto a receiving surface causes it to become damaged.

It is of course possible for the different individual variant embodiments of weakening deep perforations formed by weakening grooves to be combined.

The dispositions of the weakening deep perforations may be situated at other locations of the electronic package. For example, weakening deep perforations could be formed in the sides of the encapsulation block 16, parallel to the support plate 2.

Furthermore, the weakening deep perforations could be formed in electronic packages different from the package 1, for example packages in which the chip would be connected to the support plate via electrical connection beads encapsulated in a filler material introduced between the support plate 2 and the chip 3, with or without an encapsulation block, or in which the support plate could be replaced by a metal grid having a support platform for the chip and a plurality of electrical connection legs.

According to another variant embodiment, the weakening deep perforations may be formed at relatively large distances from the electrical connection means so that only cracking of the material surrounding them will occur, without deterioration of the electrical connection means, where these cracks can be detected and analyzed at a later stage so as to deduce from this abnormal bending stresses to which the electronic package might have been subjected.

In addition, other means of machining the weakening deep perforations such as previously described could be envisaged, for example by chemical etching.

The present invention is not limited to the examples described hereinabove. Many variant embodiments are possible without straying from the scope of the invention.

What is claimed is:

1. An electronic package, comprising:
   a support plate;
   at least one integrated circuit chip supported by said support plate;
   a plurality of electrical connection pads mounted to the support plate and electrically connected to the at least one integrated circuit chip;
   an encapsulation block encapsulating the at least one integrated circuit chip and the plurality of electrical connection pads and covering an upper surface of the at least one integrated circuit chip and respective upper surfaces of the plurality of electrical connection pads, the encapsulation block defining a first peripheral edge and a second peripheral edge opposite the first peripheral edge; and
   at least one weakening deep groove formed in the encapsulation block and extending to a short distance directly above the at least one integrated circuit chip and extending from the first peripheral edge to the second peripheral edge, said at least one weakening deep groove configured to reduce a resistance of the electronic package to bending stresses perpendicular to the support plate.

2. The electronic package according to claim 1, wherein the weakening deep groove is formed perpendicularly to the support plate.

3. The electronic package according to claim 1, wherein the weakening deep groove is formed perpendicularly to the encapsulation block.

4. The electronic package according to claim 3, wherein the weakening deep groove is disposed directly above the upper surface of the at least one integrated circuit chip.

5. The electronic package according to claim 1, wherein the at least one weakening deep groove extends continuously from the first peripheral edge to the second peripheral edge.

6. The electronic package according to claim 1, wherein the plurality of electrical connection pads are disposed in a row.

7. A method for fabricating, comprising:
   fabricating an electronic package comprising at least one integrated circuit chip, a support plate, a plurality of electrical connection pads mounted to the support plate, and an encapsulation block, the encapsulation block encapsulating the at least one integrated circuit chip and the plurality of electrical connection pads and covering an upper surface of the at least one integrated circuit chip and respective upper surfaces of the plurality of electrical connection pads, the encapsulation block defining a first peripheral edge and a second peripheral edge opposite the first peripheral edge; and forming at least one weakening deep groove in the encapsulation block directly above the at least one integrated circuit chip extending from the first peripheral edge to the second peripheral edge.

8. The method according to claim 7, wherein the forming comprises sawing.

9. The method according to claim 7, wherein the forming comprises drilling.

10. An electronic package, comprising:
a support plate;
at least one integrated circuit chip supported by said support plate;
a plurality of electrical connection pads mounted to the support plate and electrically connected to the at least one integrated circuit chip;
an encapsulation block encapsulating the at least one integrated circuit chip and the plurality of electrical connection pads and covering an upper surface of the at least one integrated circuit chip and respective upper surfaces of the plurality of electrical connection pads, the encapsulation block defining a first peripheral edge and a second peripheral edge opposite the first peripheral edge; and
at least one weakening deep groove formed in the encapsulation block and extending to a short distance directly above the plurality of electrical connection pads and extending from the first peripheral edge to the second peripheral edge, said at least one weakening deep groove configured to reduce a resistance of the electronic package to bending stresses perpendicular to the support plate.

11. The electronic package according to claim 10, wherein the weakening deep groove is formed perpendicularly to the support plate.

12. The electronic package according to claim 10, wherein the weakening deep groove is formed perpendicularly to the encapsulation block.

13. The electronic package according to claim 10, wherein the at least one weakening deep groove comprises a first groove disposed on a first side of the at least one integrated circuit chip and a second groove disposed on a second side of the at least one integrated circuit chip opposite the first side.

14. The electronic package according to claim 10, wherein the at least one weakening deep groove extends continuously from the first peripheral edge to the second peripheral edge.

15. The electronic package according to claim 10, wherein the plurality of electrical connection pads are disposed in a row and the at least one weakening deep groove extends continuously directly above the row of electrical connection pads.

16. The electronic package according to claim 10, wherein the at least one weakening deep groove is disposed directly above ends of a plurality of bonding wires connected to a respective one of the plurality of electrical connection pads.

17. A method for fabricating, comprising:
fabricating an electronic package comprising at least one integrated circuit chip, a support plate, a plurality of electrical connection pads mounted to the support plate, and an encapsulation block, the encapsulation block encapsulating the at least one integrated circuit chip and the plurality of electrical connection pads and covering an upper surface of the at least one integrated circuit chip and respective upper surfaces of the plurality of electrical connection pads, the encapsulation block defining a first peripheral edge and a second peripheral edge opposite the first peripheral edge; and
forming at least one weakening deep groove in the encapsulation block directly above the plurality of electrical connection pads extending from the first peripheral edge to the second peripheral edge.

18. The method according to claim 17, wherein the forming comprises sawing.

19. The method according to claim 17, wherein the forming comprises drilling.

20. The method according to claim 17, wherein the at least one weakening deep groove is formed directly above ends of a plurality of bonding wires connected to a respective one of the plurality of electrical connection pads.

* * * * *